United States Patent
Huang

(10) Patent No.: US 7,235,997 B2
(45) Date of Patent: Jun. 26, 2007

(54) CMOS LEAKAGE CURRENT METER

(75) Inventor: Chien-Hua Huang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/039,743

(22) Filed: Jan. 19, 2005

(65) Prior Publication Data

US 2006/0012391 A1 Jan. 19, 2006

Related U.S. Application Data

(60) Provisional application No. 60/587,668, filed on Jul. 14, 2004.

(51) Int. Cl.
*G01R 31/26* (2006.01)

(52) U.S. Cl. .................. 324/769; 324/765

(58) Field of Classification Search .............. None
See application file for complete search history.

(56) References Cited

U.S. PATENT DOCUMENTS

| | | | | |
|---|---|---|---|---|
| 3,986,152 A | * | 10/1976 | Howell | .......... 333/216 |
| 5,180,967 A | * | 1/1993 | Yamazaki | .......... 323/315 |
| 5,473,283 A | * | 12/1995 | Luich | .............. 331/8 |
| 5,576,991 A | | 11/1996 | Radjy et al. | |
| 5,642,311 A | | 6/1997 | Cleveland et al. | |
| 5,793,247 A | * | 8/1998 | McClure | .......... 327/538 |
| 6,003,118 A | | 12/1999 | Chen | |
| 6,046,932 A | | 4/2000 | Bill et al. | |
| 6,184,724 B1 | | 2/2001 | Lin | |
| 6,862,239 B1 | * | 3/2005 | Huang et al. | .......... 365/222 |
| 6,965,264 B1 | * | 11/2005 | Chan et al. | .......... 327/537 |
| 7,035,131 B2 | * | 4/2006 | Huang et al. | .......... 365/149 |
| 2002/0000581 A1 | | 1/2002 | Yamasaki | |
| 2002/0009010 A1 | | 1/2002 | Hayakawa | |
| 2002/0018387 A1 | | 2/2002 | Nam et al. | |
| 2003/0067827 A1 | | 4/2003 | Janzen | |
| 2003/0067828 A1 | | 4/2003 | Janzen | |
| 2003/0107938 A1 | | 6/2003 | Jo | |

* cited by examiner

*Primary Examiner*—Minh N. Tang
(74) *Attorney, Agent, or Firm*—Duane Morris LLP

(57) ABSTRACT

A leakage current detection circuit includes a first field effect transistor, the transistor configured to be biased to provide a leakage current, and a first current mirror in communication with the transistor operable to detect the leakage current from the transistor when the transistor is biased to provide the leakage current.

9 Claims, 14 Drawing Sheets

CMOS LEAKAGE CURRENT METER

CROSS-REFERENCE TO RELATED APPLICATIONS

This application claims priority to provisional patent application Ser. No. 60/587,668, filed Jul. 14, 2004, the entirety of which is hereby incorporated by reference herein.

This application is related to the following commonly-assigned, U.S. patent applications: Ser. No. 10/840,098, entitled "Dynamic Random Access Memory Cell Leakage Current Meter" filed on May 6, 2004, which issued as U.S. Pat. No. 7,035,131; and Ser. No. 10/696,291, entitled "Circuit and Method for Self-Refresh of DRAM Cell", filed on Oct. 29, 2003, which issued as U.S. Pat. No. 6,862,239, the contents of each being fully incorporated by reference herein.

FIELD OF THE INVENTION

The present invention is related to semiconductor devices and more specifically to devices and methods of measuring leakage current in transistor devices.

BACKGROUND OF THE INVENTION

Although used extensively in integrated circuits, CMOS devices are not ideal switches for logic functions because there exists a small leakage current. Various forms of leakage current are shown in FIG. 1a–3b. FIGS. 1a and 1b illustrate the generation of "sub-threshold" leakage current between the source and drain nodes that exists even when the transistor is in the "off" state when the voltage between gate and source node ($V_{GS}$) is lower than a threshold voltage ($V_T$) of the transistor, i.e., when $|V_{GS}|<|V_T|$. Generally, the sub-threshold current depends strongly on the voltage difference between drain and source nodes ($V_{DS}$), the threshold voltage ($V_T$) and temperature.

Another leakage source also exists, as shown in FIGS. 2a and 2b, between the drain/source nodes and the bulk of a MOS device. This current, referred to as a junction leakage current, strongly depends on the source-bulk voltage ($V_{SB}$) and the drain-bulk voltage ($V_{DB}$), the source/drain implant and the junction temperature.

A third leakage current, as shown in FIGS. 3a and 3b, is gate node leakage current that exists between the gate to bulk node and the gate to source/drain nodes. This gate node leakage current, which is referred to as gate leakage current, depends on the cross voltage between gate and bulk nodes ($V_{GB}$), the cross voltage between gate and source/drain nodes ($V_{GS}/V_{GD}$) and the gate oxide thickness. These leakages may exist singularly or, more typically, concurrently in a MOS transistor and effect the performance of the devices fabricated from the MOS transistors.

Hence, there is a need in the industry for a current monitoring means that can measure these leakage currents individually or in combination.

SUMMARY OF THE INVENTION

A leakage current detection circuit is provided comprising a first field effect transistor, the transistor configured to be biased to provide a leakage current, and a first current mirror in communication with the transistor operable to detect the leakage current from the transistor when the transistor is biased to provide the leakage current.

The above and other features of the present invention will be better understood from the following detailed description of the preferred embodiments of the invention that is provided in connection with the accompanying drawings.

BRIEF DESCRIPTION OF THE FIGURES

The accompanying drawings illustrate preferred embodiments of the invention, as well as other information pertinent to the disclosure, in which.

Figure 1B:
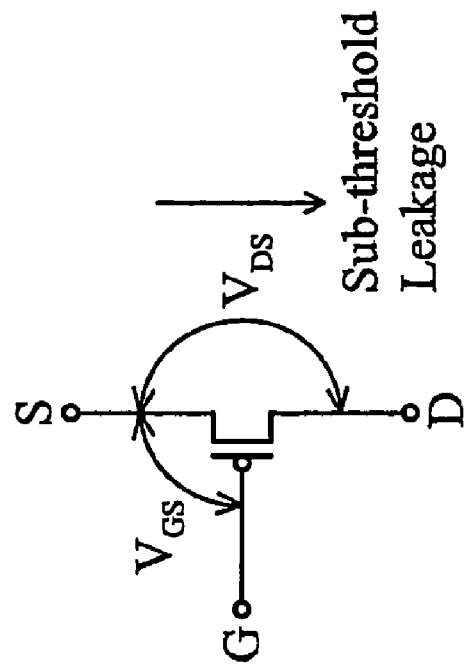
FIGS. 1a and 1b illustrate sub-threshold leakage current associated with conventional n-channel and p-channel MOS devices, respectively.
Figure 1A:
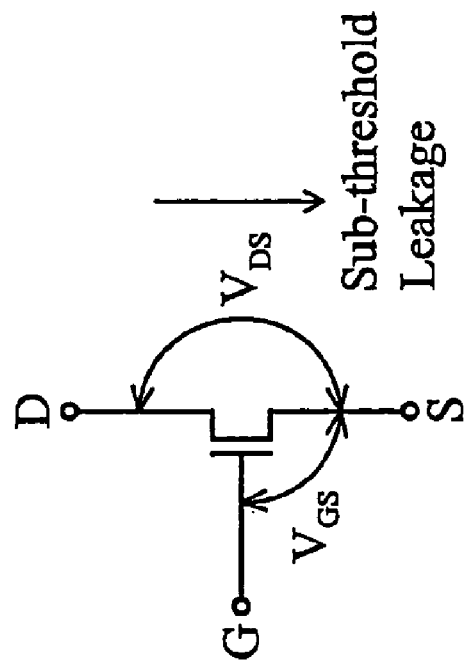
Figure 2A:
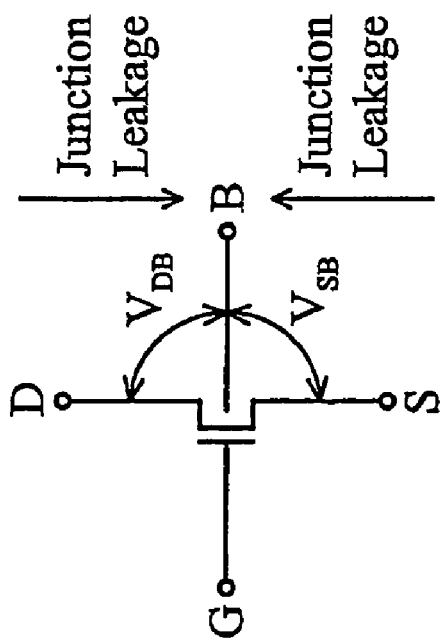
FIGS. 2a and 2b illustrate junction leakage current associated with conventional n-channel and p-channel MOS devices, respectively.
Figure 2B:
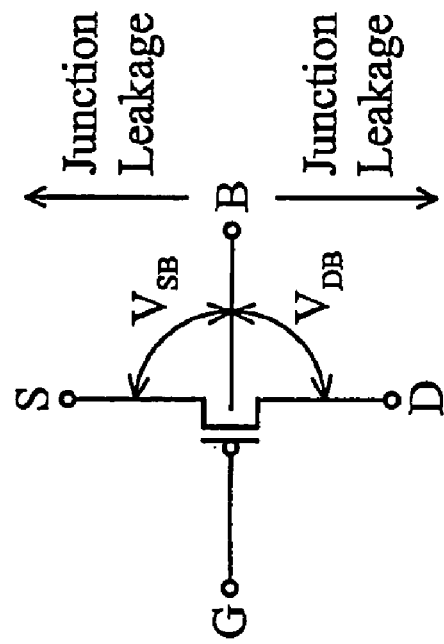
Figure 3B:
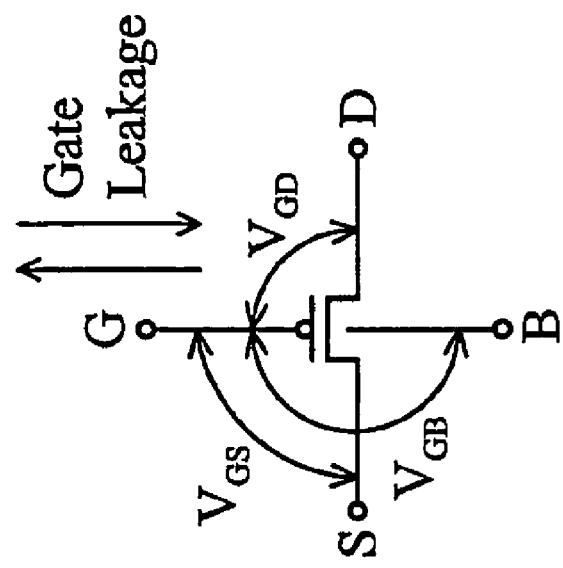
FIGS. 3a and 3b illustrate gate leakage current associated with conventional n-channel and p-channel MOS devices, respectively.
Figure 3A:
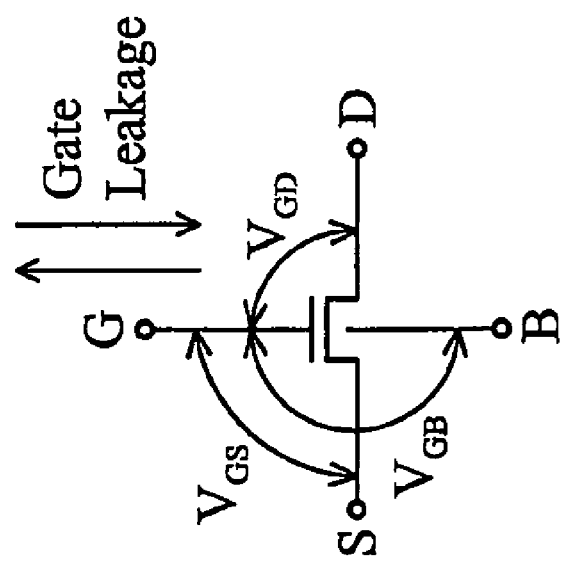

It is to be understood that these drawings are solely for purposes of illustrating the concepts of the invention and are not intended as a definition of the limits of the invention. The embodiments shown in herein and described in the accompanying detailed description are to be used as illustrative embodiments and should not be construed as the only manner of practicing the invention. Also, the same reference numerals, possibly supplemented with reference characters where appropriate, have been used to identify similar elements.

DETAILED DESCRIPTION

Figure 4A:
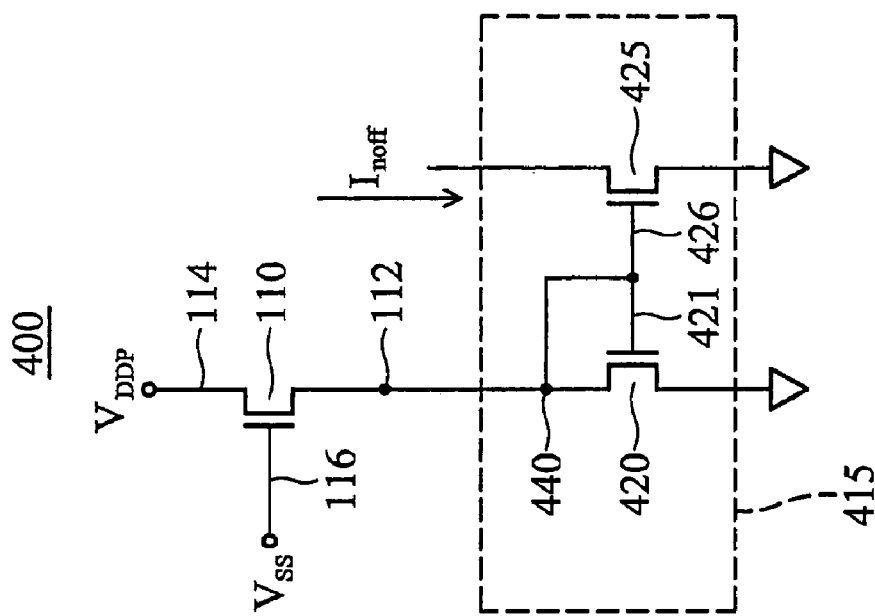
FIGS. 4a and 4b illustrate two exemplary leakage current detectors for determining sub-threshold leakage current associated with a conventional n-channel MOS device.
Figure 4B:
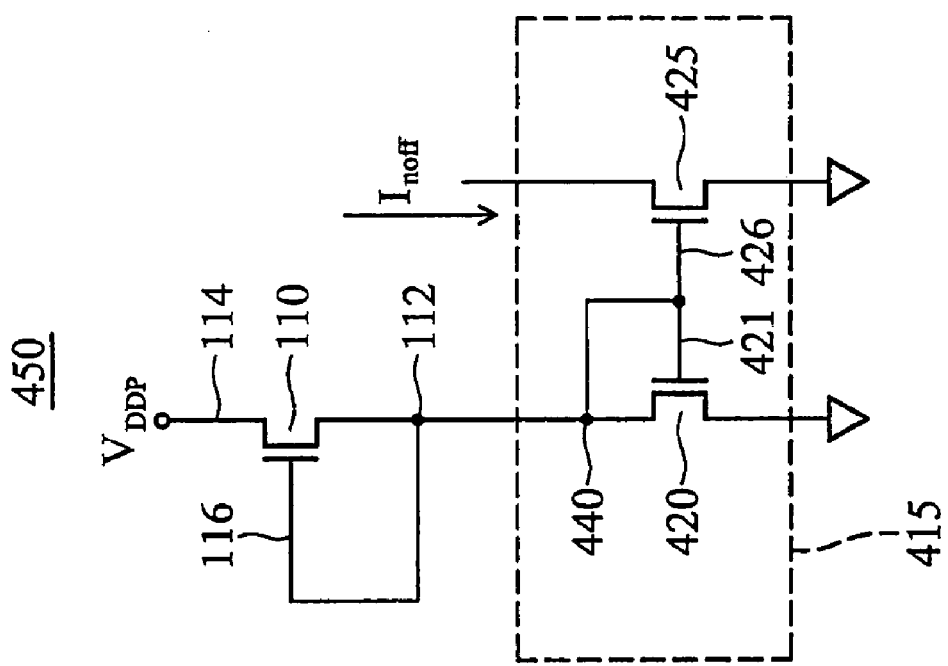

FIGS. 4a and 4b illustrate two embodiments, 400, 450, respectively, of a current detector for measuring, determining and/or extracting sub-threshold leakage current for n-channel MOS devices, such as MOS transistor 110. Referring first to FIG. 4a, MOS transistor 110 is connected at its source terminal 112 to current mirror 415, which, in one embodiment, comprises two MOS transistors 420, 425, electrically connected at their respective gate nodes 421, 426. As is also illustrated, the drain node 440 of transistor 420 is electrically connected to the commonly connected gate nodes 421, 426 of transistors 420, 425. In this illustrated case, the gate node 116 of n-channel MOS device 110 is biased at a voltage $V_{SS}$ that maintains device 110 in a "turned-off" state, as $V_{GS}$ is less than or equal to zero voltage (0V). $V_{SS}$ should be less than Vt, and preferably ground (0V)

or close to ground. The cross voltage, $V_{DS}$, of device 110 is the difference between the voltage at the drain node 114 and the source node 112, i.e., $V_{DDP}-V_{N1}$, where $V_{N1}$ is the voltage of drain node 440 of device 420. As one skilled in the art would recognize, the voltage at drain node 440 is maintained around the threshold voltage of device 420 by properly choosing the size of NMOS device 420 such that it operates within its saturation region. As is known in the art, the size of NMQS device 425 may be selected as a multiple of NMOS device 420 in order to amplify or magnify the extracted sub-threshold leakage current to provide current Inoff representative of the leakage current of NMOS 110.

In this embodiment 400, only sub-threshold leakage current is measured as the cross voltages $V_{GS}$ and $V_{BS}$ of device 110 are small such that the contribution of junction leakage and gate leakage currents is negligible. Voltage $V_{DDP}$ coupled to drain terminal 114 of NMOS 110 may be set to $V_{DD}$, the power supply voltage, or selected to provide a desired $V_{DS}$ across NMOS 110, i.e., a power supply voltage greater than VDD could be provided to enhance sub-threshold leakage current.

The embodiment 450 of FIG. 4b is identical to embodiment 400 of FIG. 4a only embodiment 450 illustrates that device 410 may alternatively be held in a "tamed-off" condition by maintaining gate node 116 at the same voltage as the source node 112.

Figure 5A:
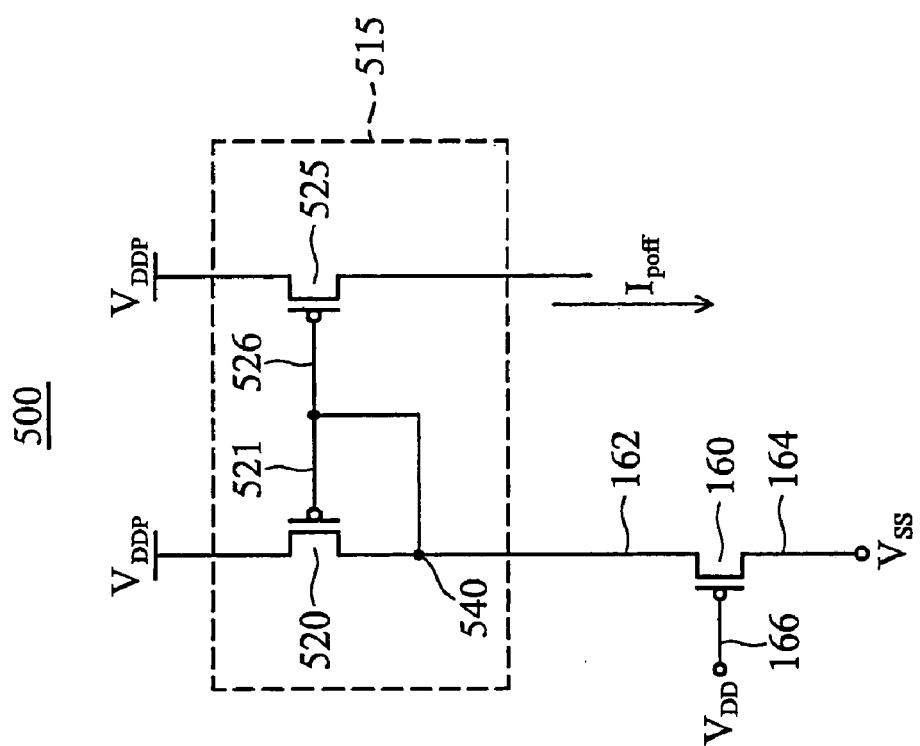
FIGS. 5a and 5b illustrate two exemplary leakage current detectors for determining sub-threshold leakage current associated with a conventional p-channel MOS device.
Figure 5B:
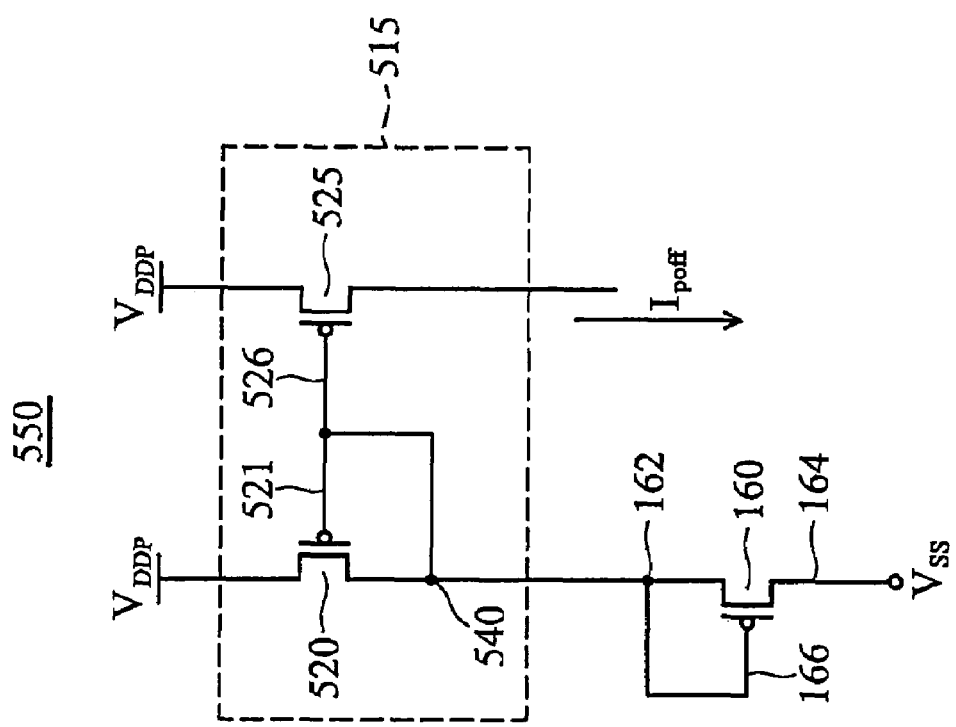

FIGS. 5a and 5b illustrate two embodiments 500, 550, respectively, of a current detector for extracting sub-threshold leakage current for p-channel MOS devices. Referring to FIG. 5a, in this illustrated embodiment, the source node 162 of PMOS device 160 is connected to current monitor 515. Current monitor 515 comprises two p-channel MOS devices 520, 525 electrically connected at their respective gate nodes 521, 526. Gate node 166 of p-channel device 160 is biased at a voltage $V_{DD}$ so that device 160 is kept in an "off state," as $V_{GS}$ is greater than or equal to zero volts (0V). The cross voltage $V_{DS}$ of device 160 is determined as $V_{N1}-V_{SS}$, where the voltage $V_{N1}$ at node 540 is in the order of $(V_{DDP}-V_{TP})$, where $V_{TP}$ the threshold voltage of PMOS 520. Voltage $V_{DDP}$ may be selected as $V_{DD}$ or chosen to meet a required value for $V_{DS}$ of device 160. The operation of mirror 515 is similar to that described above with respect to mirror 415 shown in FIG. 4a and is not repeated. The sub-threshold current of PMOS 160 is reflected in current Ipoff.

With respect to embodiment 550 of FIG. 5b, the gate node 166 and the source node 162 of device 160 are electrically connected to node 540 in a manner similar to that described with regard to the embodiment 450 of FIG. 4b. As with the embodiment of FIG. 5a, the gate node 166 of embodiment 550 is thereby set at a voltage that maintains device 160 of embodiment 550 in a "turned-off" condition.

Figure 6A:
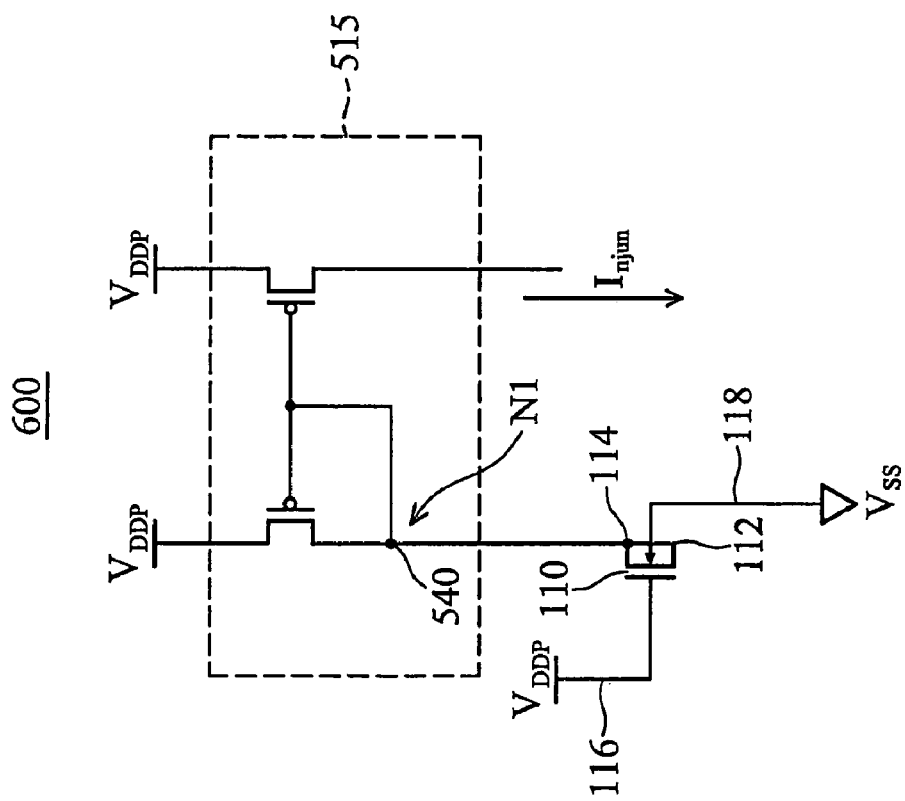
FIGS. 6a and 6b illustrate exemplary current detectors for determining junction leakage current associated with conventional n-channel and p-channel MOS devices, respectively.
Figure 6B:
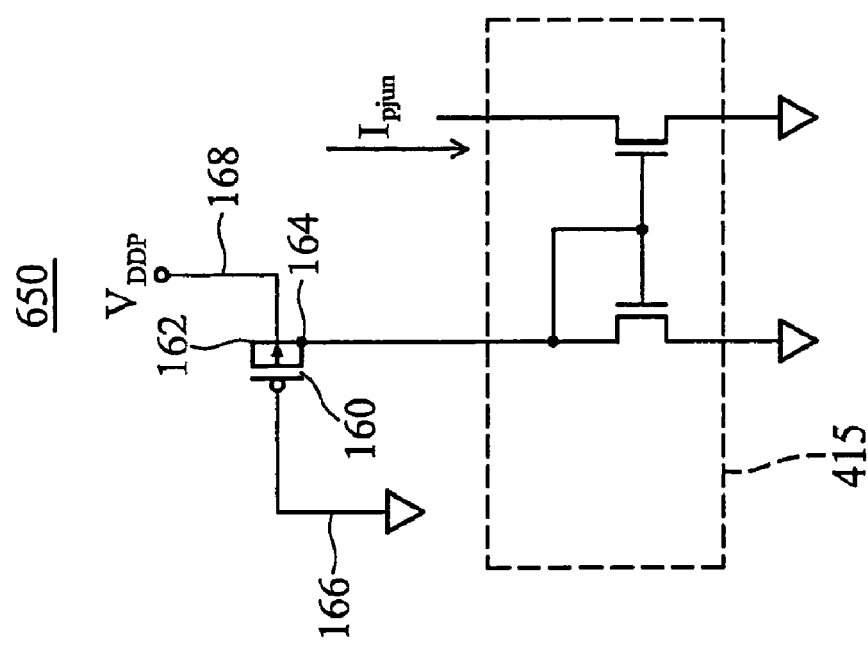

FIGS. 6a and 6b illustrate two embodiments 600, 650, respectively, of a detector for measuring, determining and/or extracting junction leakage current for n-channel and p-channel MOS devices, 110, 160, respectively. Referring first to FIG. 6a, NMOS device 110 is connected to a PMOS based current mirror 515, as described above and shown in FIGS. 5a and 5b. To extract junction leakage current, the terminal of device 110 are biased to create cross voltages between the bulk and source and bulk and drain, and preferably to eliminate gate node leakage. In one embodiment, the bulk material of transistor 110 is coupled to voltage $V_{SS}$, which is preferably at a ground or near ground, i.e., 0 volts, and source node 112 is electrically connected to drain node 114, which is coupled to node 540, thereby providing cross voltages $V_{BS}$ and $V_{BD}$. Further, gate node 116 is maintained at a voltage $V_{DDP}$ to eliminate the gate current contribution to node 540. Because the voltage at node 540 equals $V_{DDP}-V_{TP}$, the gate to source and gate to drain voltages of transistor 110 are very small. As noted, this structure can establish the cross voltage on the junction of NMOS 110, including $V_{SB}$ between node 112 and bulk node 118 and $V_{DB}$ between node 114 and bulk node 118, to collect the junction leakage contributed from the source, drain and bulk. The representative current Injun is provided by current mirror 515 in embodiment 600.

With regard to the embodiment 650 of FIG. 6b, the drain terminal 164 of device 160 is electrically connected to an NMOS-based current mirror 415, as described above and shown in FIGS. 4a and 4b. The bulk terminal 168 of device 160 is biased at voltage $V_{DDP}$ and gate node 166 is set at a lower voltage, preferably, at ground or near ground (e.g., $V_{SS}$) to limit the gate node leakage current. Source node 162 is electrically connected to drain node 164 and preferably also to ground or near ground (e.g., $V_{SS}$). This structure establishes the proper cross voltage on the junction of PMOS 160, including $V_{SB}$ between node 162 and node 168 and $V_{DB}$ between node 164 and node 168, to collect the junction leakage contributed from the source, drain and bulk. The representative current Ipjun is provided by current mirror 415 in embodiment 650.

Figure 7A:
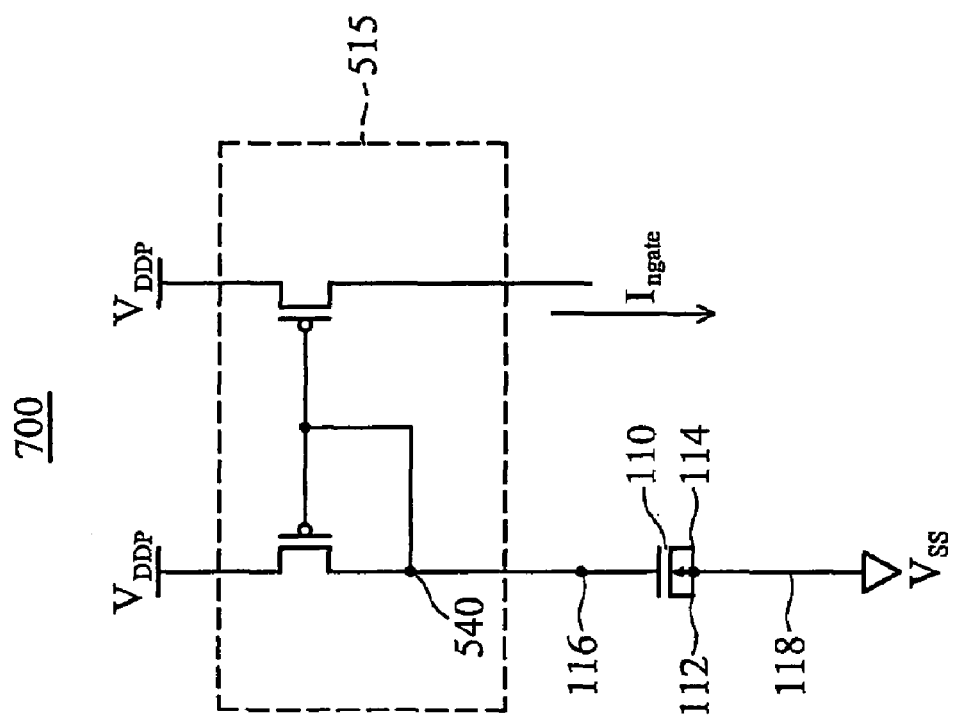
FIGS. 7a and 7b illustrate exemplary current detectors for determining gate node leakage current associated with conventional n-channel and p-channel MOS devices, respectively.
Figure 7B:
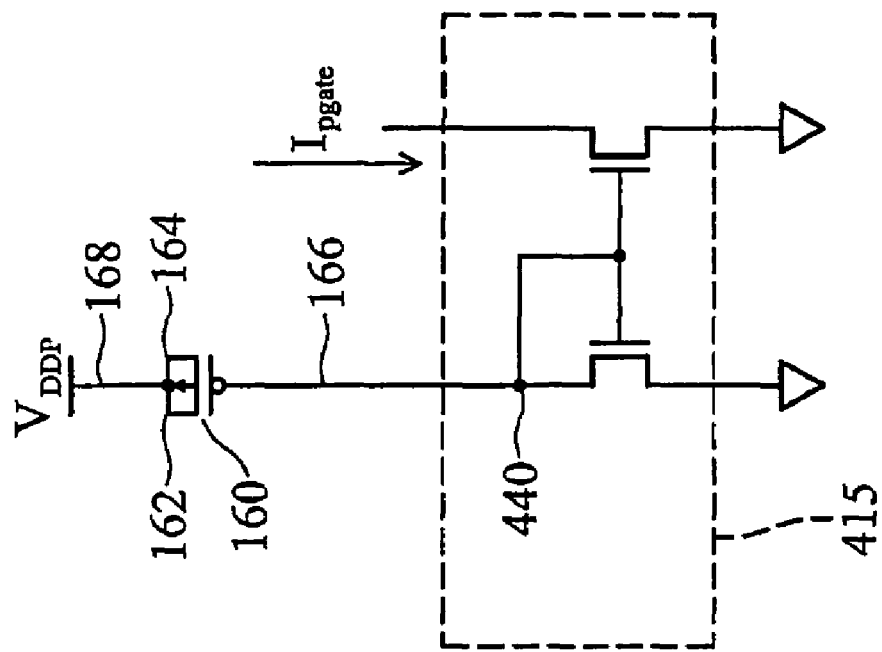

FIGS. 7a and 7b illustrate two embodiments 700, 750, respectively, of a detector for measuring, determining and/or extracting gate leakage current for n-channel and p-channel MOS devices, 110, 160 respectively. FIG. 7a illustrates gate node 116 of NMOS 114 is electrically connected to mirror circuit 515, and source node 112, drain node 114 and bulk node 118 are electrically connected. A voltage $V_{SS}$ is applied to the common source, drain and bulk nodes. Cross voltages $V_{GS}$, $V_{GD}$ and $V_{GB}$ are established such that the leakage current collected at the gate node is contributed from the source, drain and bulk of the NMOS 110. In this case there is little or no contribution of junction or sub-threshold leakage current to effect the determination of gate leakage current reflected as current Ingate by mirror 515 because there are no cross voltages between the drain, source and bulk nodes, which are electrically coupled together. The gate leakage current is shown as Ingate provided by PMOS current mirror circuit 515.

FIG. 7b illustrates a similar embodiment 750 for determining gate leakage current for PMOS device 160. Tn this embodiment, the gate terminal 166 is coupled to an NMOS current mirror circuit 415 at node 440. The bulk node 168, source node 162 and drain node 164 are electrically coupled together and to voltage VDDP to establish the cross voltages VGS, VGD and VGB such tat the leakage current collected at the gate node is contributed from the source, drain and bulk of the PMOS 160. The gate leakage current is shown as Ipgate by NMOS current mirror circuit 415.

Figure 8A:
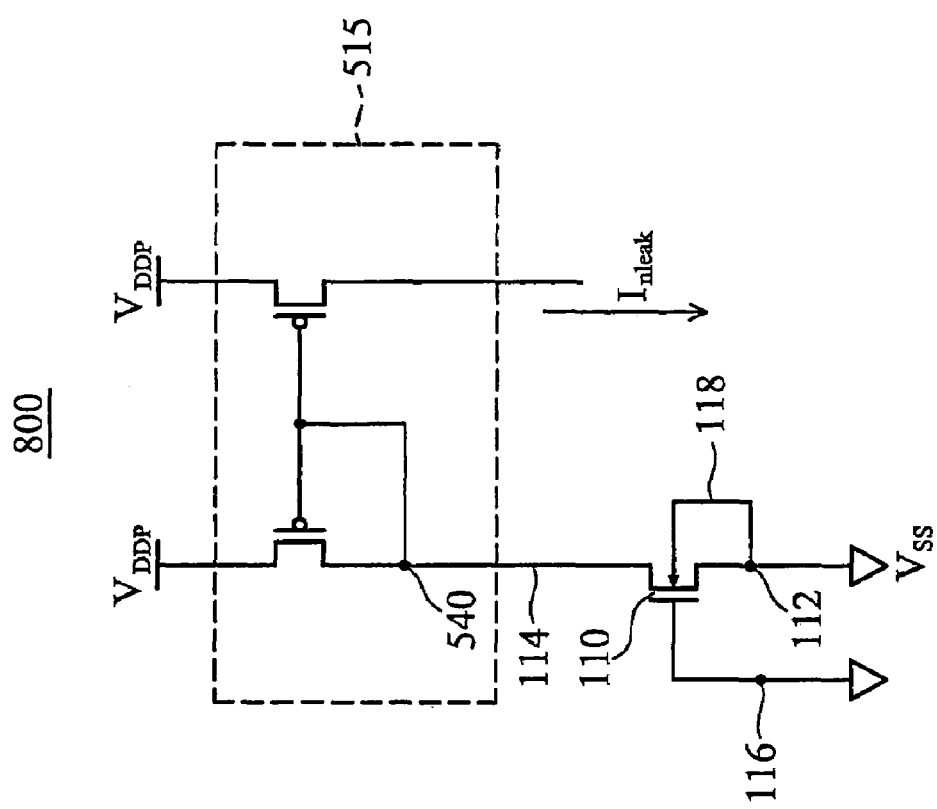
FIGS. 8a and 8b illustrate exemplary current detectors for determining total leakage current associated with conventional n-channel and p-channel MOS devices, respectively.
Figure 8B:
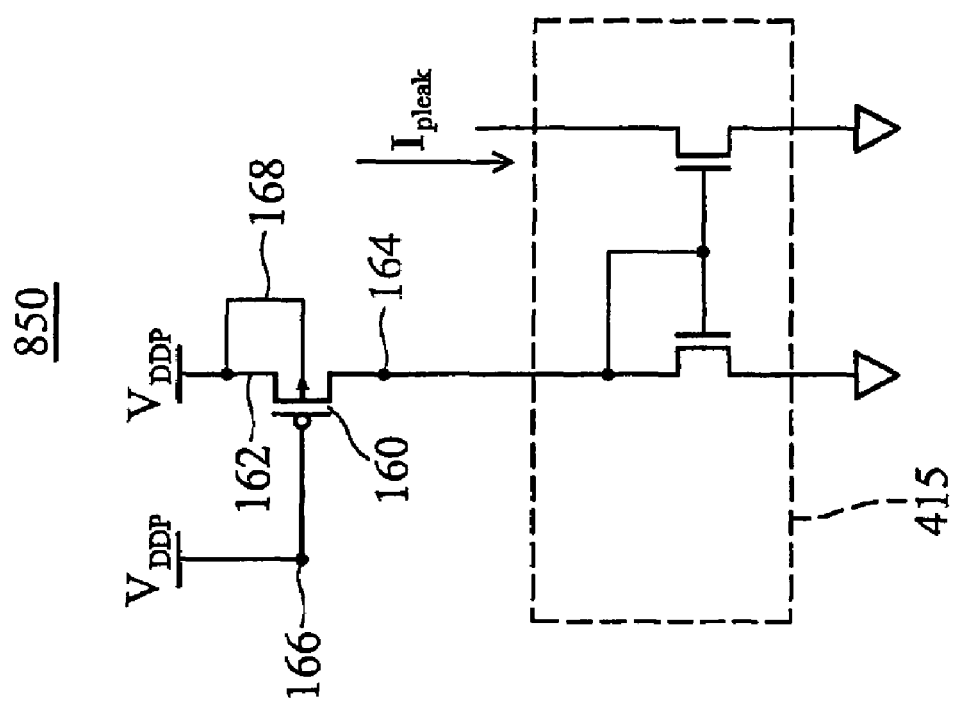

FIGS. 8a and 8b illustrate two embodiments 800, 850, respectively, of the detectors for measuring, determining and/or detecting total leakage current for n-channel and p-channel MOS devices, 110, 160 respectively. With regard to FIG. 8a, drain node 114 of n-channel MOS device 110 is connected to current mirror 515 at node 540, which has been described above with respect to FIGS. 5a, 5b, 7a and 7b. Gate node 116, source node 112 and bulk node 118 are electrically connected to a common voltage. In one embodiment, this voltage may be a zero voltage, i.e., ground, or a voltage $V_{SS}$. Voltage $V_{SS}$ may be a voltage lower than $V_{DDP}$, preferably close to ground. This structure can establish the cross voltage $V_{DS}$ between drain node 114 and source node 112 needed to collect sub-threshold leakage current, $V_{DG}$ between drain node 114 and gate node 116 to collect gate leakage current, and $V_{DB}$ between drain node 114 and bulk node to collect the junction leakage current. The leakage current from the gate node, bulk node and source node are provided at node 540. This total leakage current is reflected in current Inleak by mirror 515

With regard to FIG. 8b, drain node 164 of p-channel MOS device 160 is connected to current mirror 415, which has been described with regard to FIGS. 4a, 4b, 6a and 6b. Gate node 166, source node 162 and bulk node 168 are electrically connected to a common voltage. In one embodiment, this voltage may be a source voltage such as VDD or VDDP. Voltage VDDP may be a power supply voltage higher than VSS. This structure can establish the cross voltage VDS between drain node 164 and source node 162 to collect sub-threshold leakage, VDG between drain node 164 and gate node 166 to collect gate leakage, and VDB between drain node 164 and bulk node 168 to collect junction leakage, the total of which is reflected in current Ipleak by mirror 415.

Figure 9:
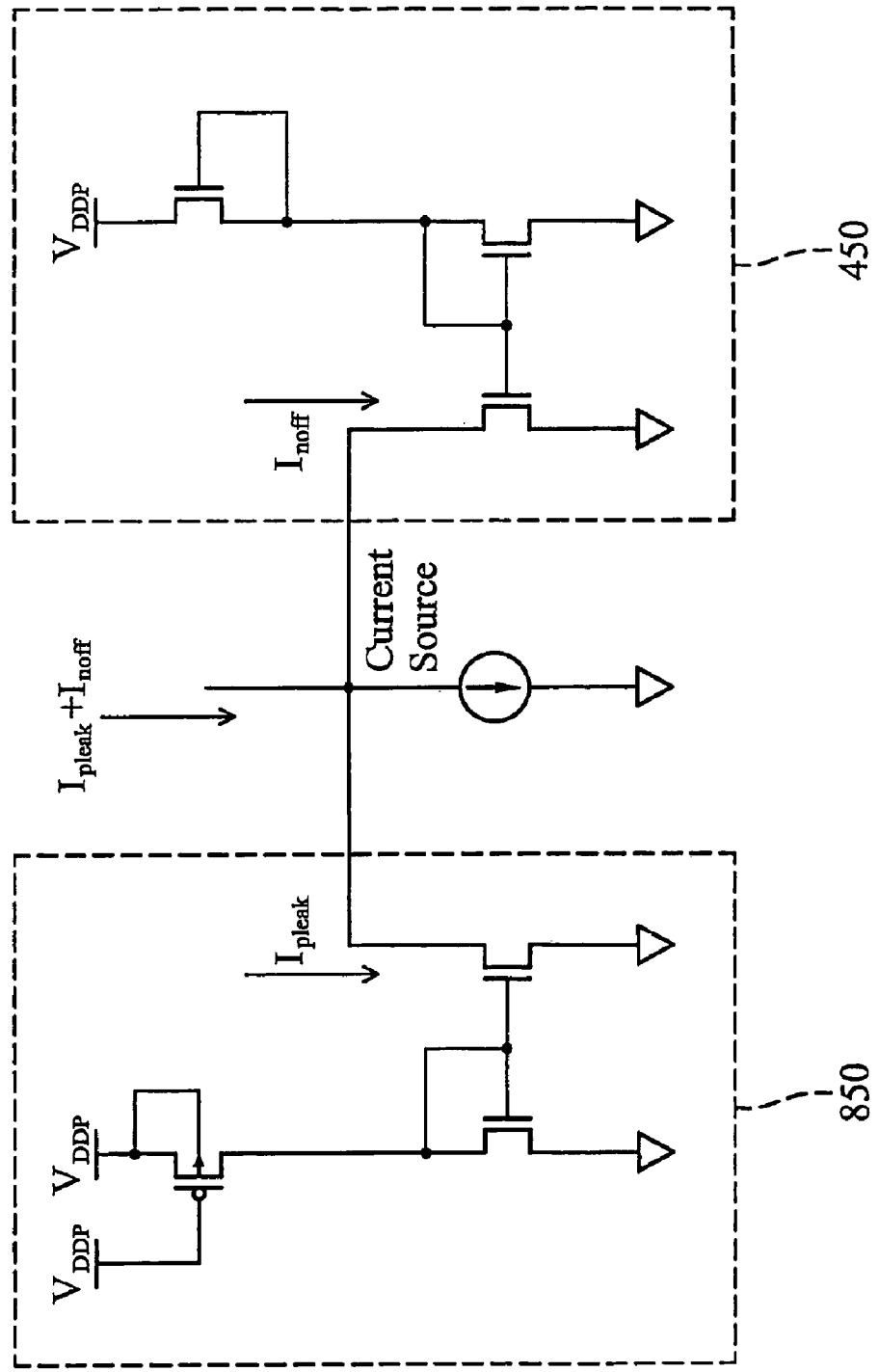
FIG. 9 illustrates an exemplary current detector combining the leakage current detectors shown in the figures herein.

FIG. 9 illustrates an exemplary embodiment 900 of a leakage current detector combining two current detectors as discussed above, specifically current detectors 450 shown in FIG. 4b and 850 shown in FIG. 8b. In this embodiment, current monitor 900 may determine a total leakage current (Ipleak) associated with monitor 850 and/or sub-threshold junction leakage current (Inoff) provided by monitor 450. The combined current may be recovered as Ipleak+Inoff. In one embodiment the combined current may be used as a reference current for the Current Source of FIG. 9, which may comprise a constant current source, as should be familiar to those in the art. Although a single embodiment of a combined current leakage current detector is shown, those skilled in the art would have sufficient knowledge from the information provided herein to formulate addition embodiments of current monitors, similar to that shown in FIG. 9, using either the individual monitors shown herein in FIGS. 4a–8b or other current monitors.

The current detectors described herein allow for the detection of the various leakage currents either separately or in total. The circuit approach is also very flexible, allowing for various combinations of the circuit detectors as desired. The circuit detectors can be utilized to provide integrated circuit (IC) operating environment information, such as supply voltages, process deviations and temperature. For example, junction leakage is very sensitive to temperature and gate leakage current is indicative of the gate oxide thickness of device. Also sub-threshold current can be used as indicative of supply voltage. Further, the detectors can be used as static power dissipation meters of a system in nature. The static power of a system is contributed from "off state" NMOS and PMOS devices. Therefore, the sub-threshold current detector can be used to monitor the static power. The current monitor circuit could be used in test ICs and/or in production ICs.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A leakage current detection circuit comprising:
   a first field effect transistor, said transistor configured to be biased to provide a leakage current; and
   a first current mirror in communication with said transistor operable to detect said leakage current from said transistor when said transistor is biased to provide said leakage current,
   wherein said transistor is configured to, when biased, provide leakage current to said current mirror consisting essentially of sub-threshold leakage current from said transistor.

2. The circuit of claim 1,
   wherein said current minor comprises at least two transistors with respective gate nodes electrically connected, and
   wherein said current mirror transistors are selected to provide a multiple of said leakage current, said multiple being greater than one.

3. The circuit of claim 1, wherein said transistor is biased to maintain said transistor in an "off" state and a source terminal of said transistor is coupled to said current mirror.

4. The circuit of claim 3, wherein said source terminal of said transistor is coupled to a gate terminal of said transistor.

5. The circuit of claim 1, wherein said transistor comprises a transistor of a first conduction type and said current mirror comprises at least two transistors of the first conduction type.

6. The circuit of claim 1, wherein said circuit further comprises a second field effect transistor configured to be biased to provide a leakage current; and
   a second current mirror in communication with said second transistor operable to detect said leakage current from said second transistor when said second transistor is biased to provide said leakage current,
   wherein said first and second current mirrors are coupled together to provide a current source.

7. The leakage current detection circuit of claim 1, wherein said transistor is biased to maintain said transistor in an "off" state and a source terminal of said transistor is coupled to provide said leakage current to said current mirror.

8. A leakage current detection circuit comprising:
   a first field effect transistor, said transistor configured to be biased to provide a first leakage current;
   a first current mirror in communication with said first field effect transistor operable to detect said first leakage current from said first field effect transistor when said first field effect transistor is biased to provide said leakage current and to provide a first representative current thereof;
   a second field effect transistor configured to be biased to provide a second leakage current;
   a second current mirror in communication with said second field effect transistor operable to detect said leakage current from said second field effect transistor when said second field effect transistor is biased to provide said leakage current and to provide a second representative current thereof,
   wherein said first and second current mirrors are coupled together to provide a current representative of a combination of said first and second representative currents.

9. The leakage current detection circuit of claim 8, wherein at least one of said current mirrors provides a multiple of said first and second leakage currents, said multiple being greater than one.

* * * * *

UNITED STATES PATENT AND TRADEMARK OFFICE
CERTIFICATE OF CORRECTION

PATENT NO. : 7,235,997 B2 Page 1 of 1
APPLICATION NO. : 11/039743
DATED : June 26, 2007
INVENTOR(S) : Chien-Hua Huang It is certified that error appears in the above-identified patent and that said Letters Patent is hereby corrected as shown below:

Column 3, Line 9, delete "NMQS" and insert therefore -- NMOS -- .

Column 3, Line 24, delete " "tamed-off" " and insert therefore -- "turned-off" -- .

Column 4, Line 44, delete "Tn" and insert therefore -- In -- .

Column 4, Line 49, delete "tat" and insert therefore -- that -- .

Column 6, Line 10, delete "minor" and insert therefore -- mirror -- .

Signed and Sealed this

Twentieth Day of November, 2007

JON W. DUDAS
*Director of the United States Patent and Trademark Office*